US006949807B2

(12) United States Patent
Eskridge et al.

(10) Patent No.: US 6,949,807 B2
(45) Date of Patent: Sep. 27, 2005

(54) SIGNAL ROUTING IN A HERMETICALLY SEALED MEMS DEVICE (75) Inventors: Mark H. Eskridge, Renton, WA (US); Peter Cousseau, Seattle, WA (US)

(73) Assignee: Honeywell International, Inc., Morristown, NJ (US)

( * ) Notice: Subject to any disclaimer, the term of this patent is extended or adjusted under 35 U.S.C. 154(b) by 74 days.

(21) Appl. No.: 10/746,463

(22) Filed: Dec. 24, 2003

(65) Prior Publication Data

US 2005/0139967 A1   Jun. 30, 2005

(51) Int. Cl.[7] ............................................. H01L 29/84
(52) U.S. Cl. ........................................ 257/415; 438/51
(58) Field of Search ................................ 257/414, 415; 438/51

(56) References Cited

U.S. PATENT DOCUMENTS

| 4,945,765 | A | | 8/1990 | Roszhart |
| 5,006,487 | A | | 4/1991 | Stokes |
| 5,334,901 | A | | 8/1994 | Albert et al. |
| 5,455,203 | A | * | 10/1995 | Koseki et al. ................ 438/5 |
| 5,456,110 | A | | 10/1995 | Hulsing, II |
| 5,456,111 | A | | 10/1995 | Hulsing, II |
| 5,585,311 | A | * | 12/1996 | Ko ............................ 438/53 |
| 5,591,679 | A | | 1/1997 | Jakobsen et al. |
| 5,948,981 | A | | 9/1999 | Woodruff |
| 5,996,411 | A | | 12/1999 | Leonardson et al. |
| 6,119,520 | A | | 9/2000 | Woodruff |
| 6,232,150 | B1 | * | 5/2001 | Lin et al. .................. 438/119 |
| 6,278,167 | B1 | * | 8/2001 | Bever et al. ............... 257/415 |
| 6,346,742 | B1 | | 2/2002 | Bryzek et al. |
| 6,359,333 | B1 | * | 3/2002 | Wood et al. ............... 257/704 |
| 6,428,713 | B1 | | 8/2002 | Christenson et al. |
| 2003/0038327 | A1 | | 2/2003 | Smith |
| 2003/0166310 | A1 | * | 9/2003 | Caplet ....................... 438/50 |

* cited by examiner

Primary Examiner—W. David Coleman
(74) Attorney, Agent, or Firm—Charles J Rupnick (57) ABSTRACT

A hermetically sealed MEMS device having a micro-machined electromechanical device, a plurality of pillars at spaced-apart positions removed from the micro-machined electromechanical device, and a peripheral seal ring completely surrounding both the micro-machined electromechanical device and the pillars, all patterned in a layer of epitaxial semiconductor silicon. A glass cover is structured to cooperate with the micro-machined electromechanical device and is sealed by the seal ring. A plurality of pass-through windows are formed internal of the cover and communicate between inner and outer surfaces of the cover. Each of the pillars covers one of the windows. A plurality of internal electrical conductors electrically couple the micro-machined electromechanical device with a surface of each of the pillars.

20 Claims, 5 Drawing Sheets

SIGNAL ROUTING IN A HERMETICALLY SEALED MEMS DEVICE

FIELD OF THE INVENTION

The present invention relates generally to devices fabricated as micro-machined electromechanical system (MEMS) devices and methods for manufacturing the same, and in particular to hermetically sealed MEMS devices and methods for routing signals into and out of MEMS devices.

BACKGROUND OF THE INVENTION

Many devices fabricated as micro-machined electromechanical systems (MEMS), both sensor and actuator devices, and methods for manufacturing the same are generally well-known. See, for example, U.S. patent application Ser. No. 09/963,142, METHOD OF TRIMMING MICRO-MACHINED ELECTROMECHANICAL SENSORS (MEMS) DEVICES, filed in the name of Paul W. Dwyer on Sep. 24, 2001, which is assigned to the assignee of the present application and the complete disclosure of which is incorporated herein by reference, that describes a MEMS acceleration sensor and method for manufacturing the same. In another example, U.S. Pat. No. 6,428,713, MEMS SENSOR STRUCTURE AND MICROFABRICATION PROCESS THEREFORE, issued to Christenson, et al. on Aug. 6, 2002, which is incorporated herein by reference, describes a capacitive acceleration sensor formed in a semiconductor layer as a MEMS device. Other known MEMS devices include, for example, micro-mechanical filters, pressure sensors, gyroscopes, resonators, actuators, and rate sensors, as described in U.S. Pat. No. 6,428,713.

Vibrating beam acceleration sensors formed in a silicon substrate as MEMS devices are also generally well-known and are more fully described in each of U.S. Pat. No. 5,334,901, entitled VIBRATING BEAM ACCELEROMETER; U.S. Pat. No. 5,456,110, entitled DUAL PENDULUM VIBRATING BEAM ACCELEROMETER; U.S. Pat. No. 5,456,111, entitled CAPACITIVE DRIVE VIBRATING BEAM ACCELEROMETER; U.S. Pat. No. 5,948,981, entitled VIBRATING BEAM ACCELEROMETER; U.S. Pat. No. 5,996,411, entitled VIBRATING BEAM ACCELEROMETER AND METHOD FOR MANUFACTURING THE SAME; and U.S. Pat. No. 6,119,520, entitled METHOD FOR MANUFACTURING A VIBRATING BEAM ACCELEROMETER, the complete disclosures of which are incorporated herein by reference. Such vibrating beam accelerometers have been fabricated from a body of semiconductor material, such as silicon, using MEMS techniques. Existing techniques for manufacturing these miniature devices are described in U.S. Pat. No. 5,006,487, entitled METHOD OF MAKING AN ELECTROSTATIC SILICON ACCELEROMETER, and U.S. Pat. No. 4,945,765, entitled SILICON MICRO-MACHINED ACCELEROMETER, the complete disclosures of which are incorporated herein by reference.

As is generally well-known, a typical MEMS device, whether a sensor or an actuator, has a size on the order of less than $10^{-3}$ meter, and may have feature sizes of $10^{-6}$ to $10^{-3}$ meter. Moving parts within a device are typically separated by microscopically narrow critical gap spacings, and as such are highly sensitive to particle contamination, such as dust and other microscopic debris. MEMS devices are also sensitive to contamination arising from corrosive environments; humidity and $H_2O$ in either the liquid or vapor phase, which may cause stiction problems in the finished device; and mechanical damage such as abrasion. MEMS devices are often required to operate at a particular pressure or in a vacuum; or in a particular liquid or gas such as, for example, dry nitrogen; and in different acceleration environments from high-impact gun barrel munitions to zero gravity deep space applications. Such application environments aggravate the device sensitivity to contamination.

The manufacture of MEMS devices includes many individual processes. Each of the individual processes may expose the device to a source of contamination. This sensitivity to particle contamination poses a challenge to the structural design and microfabrication processes associated with these small-scale, intricate and precise devices in view of the desire to have fabrication repeatability, fast throughput times, and high product yields from high-volume manufacturing. MEMS devices are typically encapsulated and sealed within a microshell, i.e., between cover plates. The microshell serves many purposes, including shielding the micro-mechanical parts of the MEMS device from damage and contamination.

Traditionally, MEMS devices utilize a wafer stack or "sandwich" design of two or three stacked semiconductor silicon wafers, with the sensor or actuator device mechanism wafer being positioned in the center between two outside cover wafers or "plates" in a three-wafer device. The cover plates are formed, for example, in respective silicon wafers. Alternatively, the cover plates are formed in respective Pyrex RTM glass wafers.

In a two-wafer device, a single cover plate is mounted on top of the mechanism wafer. The cover plates are bonded to the mechanism wafer in a three dimensional MEMS device. A frit glass seal or another conventional mechanism bonds the cover plates to the mechanism wafer along their common outer edges or peripheries. Other common bonding mechanisms include, for example, eutectic metal-to-metal bonding, silicon-to-silicon fusion bonding, electrostatic silicon-to-silicon dioxide bonding, and anodic bonding for silicon-to-glass bonds. The cover plate wafer or wafers act as mechanical stops for movable portions of the mechanism wafer, thereby protecting the mechanism device from forces that would otherwise exceed the device's mechanical limits.

Electrical connections to the sensitive portions of the mechanism wafer typically require one or more bond wires that pass through window apertures in one cover plate and connect to conductive paths formed on the surface of the mechanism wafer. These conductive paths and the corresponding windows in the cover plate have traditionally been located within the interiors of the respective mechanism and cover wafers, thus being interior of the seals that bond the cover plates to the mechanism wafer along their respective peripheral edges. These internal windows can allow particulate contamination or moisture to invade the interior of the MEMS device during handling, transportation, testing or wire bonding operations, which can result in premature failure.

Figure 1:
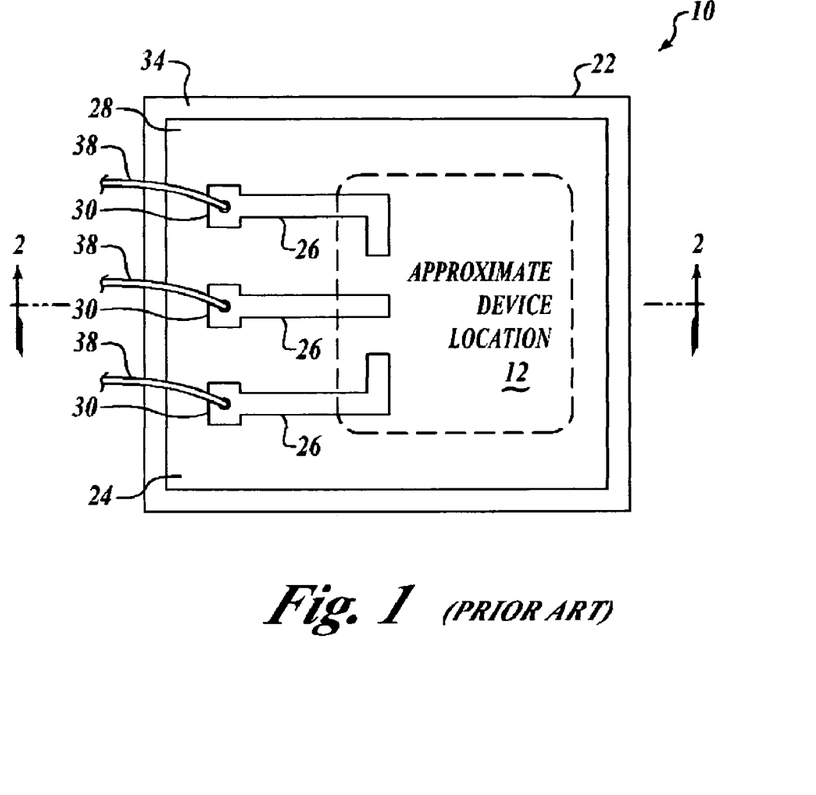
FIG. 1 is a plan view of a first conventional MEMS device of the prior art having conventional conductive paths for routing signals into and out of MEMS devices.
Figure 2:
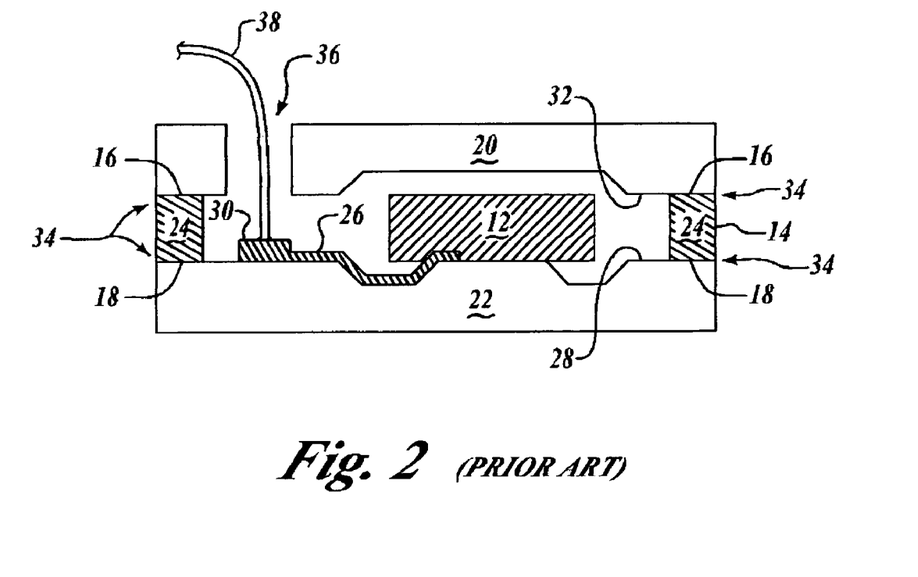
FIG. 2 is a cross-sectional side view of the prior art MEMS device illustrated in FIG. 1.

FIGS. 1 and 2 are plan and cross-sectional side views, respectively, of a first conventional MEMS device 10 of the prior art having the conventional conductive paths for routing signals into and out of MEMS devices. In FIG. 1 the prior art MEMS device 10 is shown open, i.e., without its top cover and with the MEMS sensor or actuator device mechanism removed for clarity. The prior art MEMS device 10 includes a MEMS sensor or actuator device mechanism bonded to the inner surface 28 of a bottom cover plate 22 at a position indicated generally at 12. As illustrated in FIG. 2, the MEMS device mechanism is formed in an interior portion of a mechanism wafer 14, which is an epitaxial layer of semiconductor silicon.

As illustrated in FIG. 2, top and bottom cover plates 20, 22 are sized to cover at least the device mechanism 12 and a peripheral frame portion 24 of the epitaxial silicon mechanism wafer 14 from which the device mechanism 12 is suspended. One or more electrical conductors 26, usually gold traces, are formed on an inner surface 28 of the bottom cover plate 22 and arranged for being electrically interconnected to with the device mechanism 12 by means well-known in the art. The electrical conductors 26 extend outwardly across the inner surface 28 of the bottom cover plate 22 to different conventional metal wire bond pads 30 that are positioned on the surface 28 of the bottom cover plate 22 outside the area occupied by the device mechanism 12. The electrical conductors 26 thus provide remote electrical access to the device mechanism 12.

The top and bottom cover plates 20, 22 are bonded or otherwise adhered to respective top and bottom surfaces 16, 18 of the mechanism wafer 14. The top and bottom cover plates 20, 22 each have a respective substantially planar inner surface 32, 28 that is bonded to the respective top and bottom surfaces 16, 18 of the mechanism wafer 14 using an appropriate conventional bonding mechanism 34 that is provided in a pattern in between the top cover plate 20 and the top surface 16 of the epitaxial silicon mechanism wafer 14, and between the bottom cover plate 22 and the mechanism wafer bottom surface 18. The bonding mechanism 34 is, for example, an adhesive bonding agent in a pre-form of glass frit, a eutectic metal-to-metal bond, a silicon-to-glass anodic bond, or an electrostatic silicon-to-silicon dioxide bond, as appropriate. The pattern of the bonding mechanism 34 is external to and may completely surround the device mechanism 12 and the wire bond pads 30.

As illustrated in FIG. 2, the top cover plate 20 is sized to cover at least the device mechanism 12 and the wire bond pads 30. Of necessity, a quantity of pass-through window apertures 36 are formed in the top cover plate 20 in alignment with the wire bond pads 30. In practice, the MEMS device 10 is cut out after the cover plates 20, 22 have been installed, so that the three stacked wafers, i.e., the device mechanism wafer 14 and the cover plates 20, 22, are all the same size, and the epitaxial silicon mechanism wafer 14 is completely and exactly covered by the top cover plate 20 (in a two-wafer stack) and the bottom cover plate 22 (in a three-wafer stack). The pass-through window apertures 36 in the top cover plate 20 provide access for connecting electrical wires 38 to the bond pads 30 for routing signals into and out of the device mechanism 12.

The pass-through window apertures 36 in the top cover plate 20 of the prior art device 10 illustrated in FIGS. 1 and 2 are located within the interior of the seals provided by bonding mechanisms 34 that bond the cover plates 20, 22 to the mechanism wafer 14 along their respective peripheral edges. These internal apertures 36 can allow particulate contamination or moisture to invade the interior of the MEMS device 10 during handling, transportation, testing or wire bonding operations, which can result in premature failure.

Figure 3:
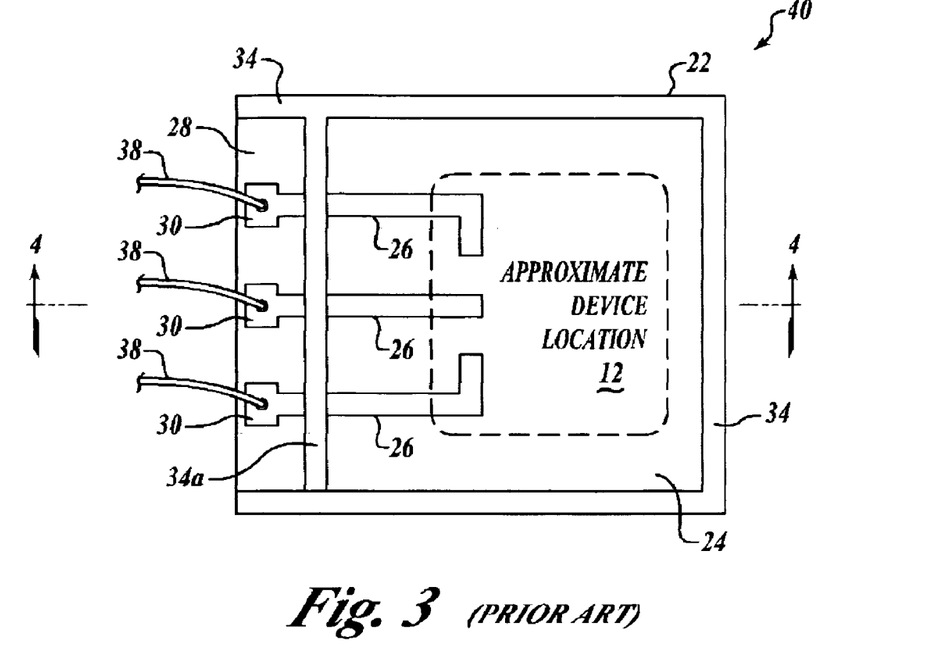
FIG. 3 is a plan view of another conventional MEMS device of the prior art having conventional conductive paths for routing signals into and out of MEMS devices.
Figure 4:
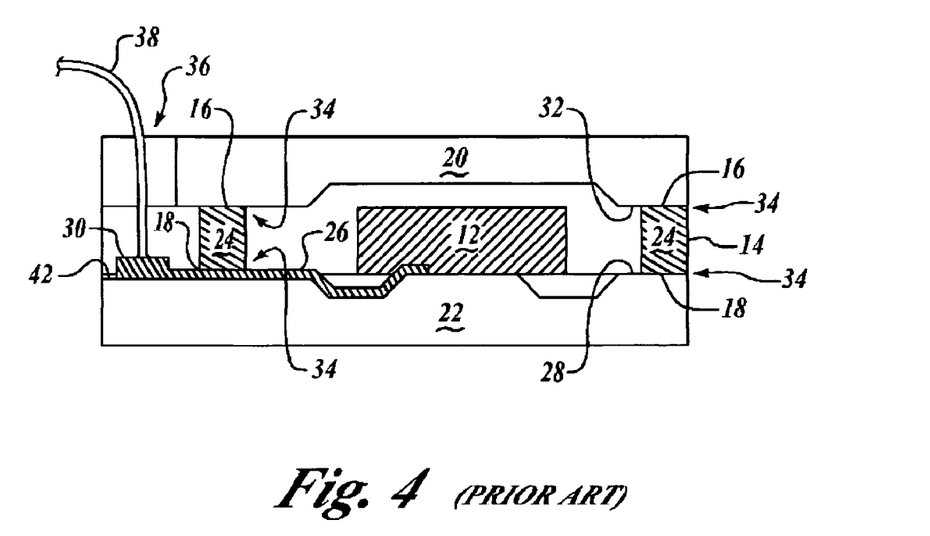
FIG. 4 is a cross-sectional side view of the prior art MEMS device illustrated in FIG. 3.

FIGS. 3 and 4 are plan and cross-sectional side views, respectively, of a second conventional MEMS device 40 of the prior art solution to the contamination problems inherent in the device 10 of FIGS. 1 and 2. The prior art MEMS device 40 has the conventional gold trace conductive paths 26 extended to a quantity of the conventional metal wire bond pads 30 positioned outside the seal 34 of the top cover 20. In FIG. 3 the MEMS device 40 is shown open, i.e., without its top cover, and with the MEMS sensor or actuator device mechanism removed for clarity. The MEMS device 40 includes a MEMS sensor or actuator device mechanism that is formed in the interior portion of the epitaxial silicon mechanism wafer 14, suspended from the mechanism wafer peripheral frame portion 24 and bonded to the inner surface 28 of a bottom cover plate 22 at a position indicated generally at 12.

The gold traces of electrical conductors 26 are formed on the inner surface 28 of the bottom cover plate 22. The gold trace electrical conductors 26 are electrically interconnected to the device mechanism 12 and extend outwardly across the inner surface 28 of the bottom cover plate 22 to the metal wire bond pads 30 that are positioned on the bottom cover plate inner surface 28 remote from the device mechanism 12 and which thereby provide remote electrical access to the device mechanism 12.

As illustrated in FIG. 4, the top and bottom cover plates 20, 22 are bonded or otherwise adhered to respective top and bottom surfaces 16, 18 of the mechanism wafer 14. The cover plates 20, 22 are formed having respective surfaces 32, 28 that are bonded to the respective top and bottom surfaces 16, 18 of the mechanism wafer 14 using an appropriate conventional bonding technique. The bottom cover plate 22 is sized to cover at least the device mechanism 12 and the supporting peripheral frame portion 24. The top cover plate 20 is sized to cover at least the device mechanism 12 and the supporting peripheral frame portion 24 while exposing the wire bond pads 30 on the bottom cover 22. The pass-through window apertures 36 in the top cover plate 20 are aligned with the wire bond pads 30 on the bottom cover plate 22, and thereby provide access for connecting electrical wires 38.

The pattern of the bonding mechanism 34 includes a portion 34a that lies between the device mechanism 12 and the wire bond pads 30 and overlies a portion of the electrical conductors 26. The wire bond pads 30 thus lie outside the pattern of the bonding mechanism 34 surrounding the device mechanism 12. The window apertures 36 in the top cover plate 20 also lie outside the confines of the pattern of the bonding mechanism 34.

The bonding mechanism 34 is optionally conventional anodic bonding when the cover plates 20, 22 are formed in respective Pyrex RTM glass wafers which is a well-known glass with a thermal expansion coefficient well matched to that of silicon. Anodic bonding can also be performed using thin glass films deposited by sputtering on a silicon substrate. Anodic bonding, however, fails to seal between the bottom cover plate 22 and the gold of the electrical conductors 26. The electrical conductors 26 thus prevent the bonding mechanism 34 from forming a hermetic seal.

Also, as illustrated in FIG. 4, the gold traces of the electrical conductors 26 are typically partially submerged beneath the bottom cover plate inner surface 28 in shallow troughs 42 etched in the cover plate inner surface 28. The partially submerged gold traces 26 also extend above the cover plate inner surface 28 by a small amount which may be on the order of 500 to 1000 Angstroms. Although small, this irregularity in the bottom cover plate inner surface 28 detracts from the seal by holding the inner surface 32 of the top cover plate 20 away from the bottom surface 18 of the mechanism wafer 14 so that no seal is formed in the immediate vicinity of the gold traces 26.

An alternative solution is disclosed in co-pending U.S. patent application Ser. No. 10/226,518, HERMETICALLY SEALED SILICON MICRO-MACHINED ELECTROME- CHANICAL SYSTEM (MEMS) DEVICE HAVING DIFFUSED CONDUCTORS, filed in the name of Stephen C. Smith on Aug. 22, 2002, which is assigned to the assignee of the present application and the complete disclosure of which is incorporated herein by reference, wherein a hermetically sealed sensor or actuator device mechanism is electrically interconnected by diffused conductive paths to a plurality of wire bond pads that are located external to the hermetic seal.

SUMMARY OF THE INVENTION

The present invention overcomes the limitations of the prior art by providing a truly hermetically sealed MEMS device. According to one aspect of the invention, the truly hermetically sealed MEMS device of the invention includes a micro-machined electromechanical device patterned in a layer of epitaxial semiconductor silicon; a plurality of pillars patterned in the layer of epitaxial semiconductor silicon at spaced-apart positions removed from the micro-machined electromechanical device; a closed seal ring patterned in the layer of epitaxial semiconductor silicon and completely surrounding both the micro-machined electromechanical device and the pillars; a first glass cover structured to cooperate with the micro-machined electromechanical device and being anodically bonded in a sealed arrangement with the seal ring; a plurality of pass-through windows formed at an internal portion of the cover, the windows communicating between an inner surface of the cover that is adjacent to the micro-machined electromechanical device and an outer surface of the cover that is spaced away from the micro-machined electromechanical device; a window seal formed between each of the pillars and a portion of the cover inner surface surrounding one of the window, the window seal being an anodic bond between the pillar surface and the cover inner surface; a peripheral seal formed between the closed seal ring and a peripheral portion of the cover inner surface; and a plurality of internal electrical conductors with one of the internal electrical conductors formed between the micro-machined electromechanical device and a surface of each of the pillars.

According to another aspect of the invention, the hermetically sealed MEMS device includes a second glass cover structured to cooperate with the micro-machined electromechanical device and anodically bonded in a sealed arrangement with the seal ring opposite from the first cover.

According to another aspect of the invention, the hermetically sealed MEMS device includes an external wire bond pad electrically coupled to a surface of the pillar exposed in the window. The wire bond pad is optionally formed on the surface of the pillar exposed in the window. Alternatively, the wire bond pad is formed on an external surface of the cover containing the window and is electrically coupled to the surface of the pillar exposed in the window by an electrical conductor.

According to another aspect of the invention, the present invention overcomes the limitations of the prior art by providing a method of forming a hermetically sealed MEMS device, the method includes, in an epitaxial layer of semiconductor silicon, forming each of a micro-machined electromechanical device, a pillar physically separated from the micro-machined electromechanical device, and a seal ring surrounding the micro-machined electromechanical device and the pillar. The also method includes forming in one or more glass substrates one or more cover plates having an internal surface structured to cooperate with the micro-machined electromechanical device and having a peripheral surface structured for joining to the seal ring, one of the cover plates being formed with a window that communicates between an inner surface and an outer surface of the cover plate.

Furthermore, the method includes anodically bonding the micro-machined electromechanical device to one of the cover plates; anodically bonding the pillar to the cover plate having the window formed therein in a sealing arrangement with the inner surface of the cover plate surrounding the window; and anodically bonding the seal ring to each of the one or more cover plates in a sealing arrangement surrounding the micro-machined electromechanical device and the pillar. The micro-machined electromechanical device is electrically coupled with a portion of the pillar internal of the outer surface of the cover plate having the window formed therein. A metal wire bond pad is electrically coupled to a surface of the pillar exposed in the window, the wire bond pad is either formed directly on the surface of the pillar exposed in the window or the wire bond pad positioned on the cover plate remotely from the window and is electrically coupled to the pillar by an electrical conductor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for using wide columns of anodically bonded semiconductor silicon to route signals by conductive paths to a plurality of wire bond pads that are located external to the hermetic seal of hermetically sealed micro-machined electromechanical system (MEMS) devices and methods for manufacturing the same. Accordingly, the apparatus and method of the invention are realized in a hermetically sealed MEMS device having a micro-machined electromechanical device formed of semiconductor silicon and a pair of spaced apart top and bottom cover plates, the cover plates being made either of respective Pyrex RTM glass wafers or of silicon substrates having thin glass inner surfaces deposited thereon of a type that are known to be suitable for forming anodic silicon-to-glass bonds. The cover plates having their inner glass surfaces structured to cooperate with the micro-machined electromechanical device, the inner glass surface of one of the cover plates being further formed with a plurality of electrical conductors extended between the micro-machined electromechanical device and a portion of the inner surface remote from the micro-machined electromechanical device, and one of the cover plates being further formed with a pass-through window communicating between the inner surface of the cover plate and an exterior surface thereof. The MEMS device also having a pillar formed of semiconductor silicon and anodically bonded to the inner surface of the cover plate containing the window in a closed ring surrounding the window. A peripheral seal ring is formed of semiconductor silicon and surrounds the micro-machined electromechanical device and the pillar. The peripheral seal ring is anodically bonded between the glass inner surfaces of the spaced apart top and bottom cover plates. An electrical conductor is extended between the micro-machined electromechanical device and the pillar, and a wire bond pad is electrically coupled to the pillar through the window.

The Figures illustrate by example and without limitation the conductive paths, the wide columns of anodically bonded semiconductor silicon aligned with internal pass-through cover windows and hermetic sealing bond and of the invention embodied in a MEMS sensor or actuator device 100 which is, for example, a capacitive or vibrating beam acceleration sensor or another MEMS device such as an accelerometer, a pressure sensor, a gyroscope, a resonator, an actuator, or a rate sensor, the basic art of which are all generally well-known, or another MEMS sensor or actuator device.

Figure 5:
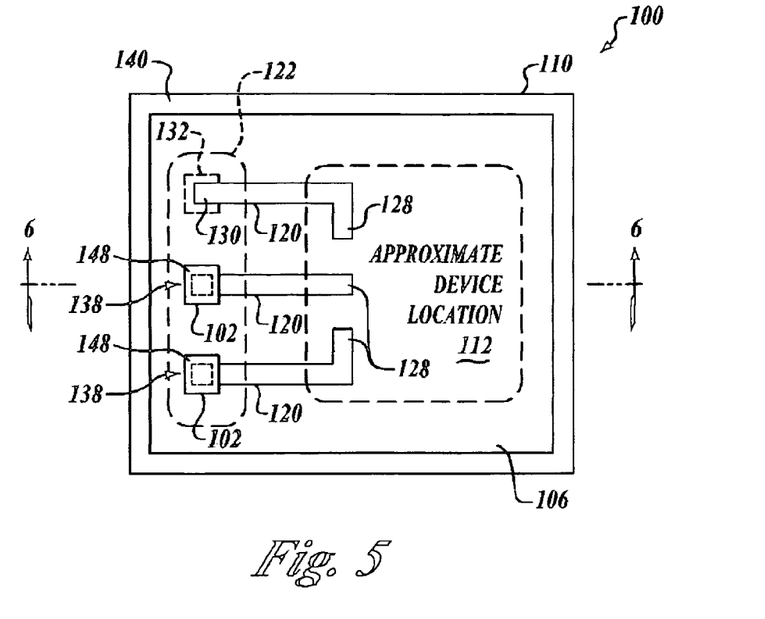
FIG. 5 is a plan view of the hermetically sealed MEMS device of the invention having semiconductor silicon pillars operating as conductive paths for routing signals into and out of MEMS devices.
Figure 6:
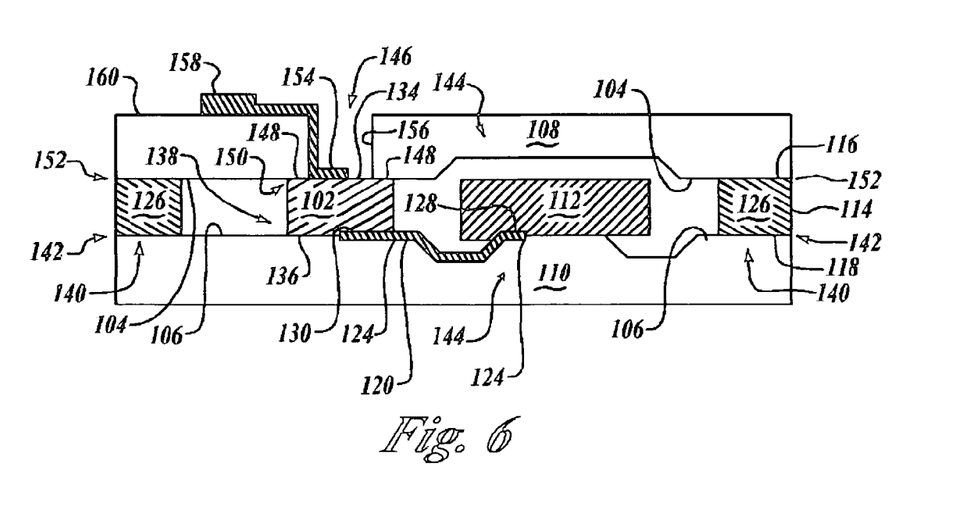
FIG. 6 is a cross-sectional side view of the hermetically sealed MEMS device of the invention illustrated in FIG. 5.

FIG. 5 is a plan view and FIG. 6 is a cross-sectional side view that illustrate the present invention embodied in a micro-machined electromechanical system (MEMS) device 100 having wide columns 102 of anodically bonded semiconductor silicon to route signals into and out of a hermetically sealed device mechanism. In FIG. 1 the MEMS device 100 is shown open, i.e., without its top cover and with the MEMS sensor or actuator device mechanism removed for clarity. The MEMS device 100 includes a MEMS sensor or actuator device mechanism bonded to respective inner surfaces 104 and 106 of a top cover plate 108 (shown in FIG. 6) and a bottom cover plate 110 (shown in FIG. 5) at a position indicated generally at 112. The top and bottom cover plates 108, 110 are relieved to provide appropriate mechanism support and relief structures 144 that cooperate with the MEMS device mechanism 112.

As illustrated in FIG. 6, the MEMS device mechanism 112 is patterned in an interior portion of a mechanism substrate 114 which is an epitaxial layer of semiconductor silicon grown on a silicon wafer and having substantially planar and parallel spaced apart top and bottom surfaces 116, 118. When the MEMS device 100 utilizes silicon-to-glass anodic bonding for bonding the semiconductor silicon mechanism substrate 114, the top and bottom cover plates 108, 110 are formed in respective Pyrex RTM glass wafers of a type having a thermal expansion coefficient substantially matched to that of silicon. Alternatively, as is known in the prior art, silicon-to-glass anodic bonding can be utilized when the top and bottom cover plates 108, 110 are formed in respective silicon substrates having thin glass films deposited thereon, as by sputtering.

One or more internal electrical conductors 120 are electrically interconnected to the device mechanism 112 and extend outwardly to a remote area 122 of the bottom cover plate 110 that is spaced away from the device mechanism 112. As disclosed in the prior art, the electrical conductors 120 may be partially submerged in the bottom cover plate 110 within shallow troughs or channels 124 formed in the cover plate inner surface 106. Typically, the gold traces of which the electrical conductors 120 are formed extend above the cover plate inner surface 106 by about 500 to 1,000 Angstroms. In prior art devices, the protruding electrical conductors 120 thus interfered with formation of a truly hermetic seal between the bottom cover plate 110 and a peripheral seal portion 126 of the epitaxial silicon mechanism substrate 114 from which the device mechanism 112 may be suspended and which completely surrounds the device mechanism 112. The electrical conductors 120 each include an electrical contact 128 portion formed of electrically conductive gold at a first end of the gold trace conductor 120 adjacent to the device mechanism 112 and projected above the bottom cover plate inner surface 106 generally. This electrical contact 128 is crushed or mashed against the bottom surface 118 of the mechanism substrate 114 during assembly to the bottom cover plate 110. The electrical contact 128 thus makes an electrical connection to the semiconductor material of the MEMS device mechanism 112 of a type that is well-known in the prior art.

According to the present invention, each of the gold trace electrical conductors 120 further includes a second electrical contact 130 portion formed at a second end of the gold trace electrical conductor 120 and above the inner surface 106 of the bottom cover plate 110. The second electrical contact 130 is provided at a second end of the electrical conductor 120 within the remote area 122 of the bottom cover plate 110 that is spaced away from the device mechanism 112.

Alternatively, the conductor 120 are formed as buried diffused conductors doped by ion implantation, as described in co-pending U.S. patent application Ser. No. 10/226,518 which is incorporated herein by reference. The first and second electrical contacts 128, 130 are formed as metal interconnection areas coupled to the buried diffused conductors via contact diffusions. Optionally, the diffused conductors are buried under an epitaxial layer and are electrically coupled to the metal interconnection areas 128, 130 via contact diffusions and contact holes in the passivation 28, as described by Jakobsen et al. in U.S. Pat. No. 5,591,679, SEALED CAVITY ARRANGEMENT METHOD, the complete disclosure of which is incorporated herein by reference.

Subsequently, during formation of the MEMS device mechanism 112 and the peripheral seal portion 126, a plurality of semiconductor silicon columns or "pillars" 102 are patterned in the epitaxial silicon mechanism substrate 114 simultaneously with the device mechanism 112. The semiconductor silicon pillars 102 are formed in alignment with the second electrical contacts 130 that are provided at a second end of the electrical conductor 120 within the remote area 122 of the bottom cover plate 110. For example, a foot print 132 of one of the pillars 102 is illustrated in FIG. 5 covering and surrounding one of the second electrical contacts 130 at the end of the one of the electrical conductors 120. Others of the semiconductor silicon pillars 102 are illustrated as being emplaced in mechanical and electrical contact with the second electrical contacts 130 at the second ends of other electrical conductors 120.

Each of the pillars 102 is patterned in the same silicon mechanism substrate 114 with the MEMS device mechanism 112 and its peripheral seal portion 126. Each of the pillars 102 therefore includes substantially planar and parallel spaced apart top and bottom surfaces 134 and 136 that are coplanar with the top and bottom surfaces 116, 118 of the mechanism substrate 114. During assembly and anodic bonding of the silicon mechanism substrate 114 to the bottom cover plate 110, the second electrical contacts 130 are crushed or mashed against the bottom surfaces 136 of the silicon pillars 102, similarly to the electrical contacts 128 being crushed or mashed against the bottom surface 118 of the mechanism substrate 114 during assembly to the bottom cover plate 110. Electrical contact is thereby assured between the device mechanism 112 and the silicon pillars 102 in the remote portion 122 of the bottom cover plate 110. The silicon pillars 102 are oversized relative to the electrical conductors 120, as illustrated by the foot print 132 of one of the pillars 102 illustrated in FIG. 5, so that the pillars 102 overlap the cover plate surface 106 around the corresponding contacts 130 and electrical conductors 120.

An anodic bond 138 is formed between the portion of the pillar bottom surfaces 136 that is extended around the different electrical conductors 120 and the bottom cover plate 110, whereby the silicon pillars 102 are securely fixed to the bottom cover plate 110. Additionally, the peripheral support structure 126 completely surrounding the device mechanism 112 contacts a peripheral portion 140 of the bottom cover plate surface 106 and is simultaneously assembled to the bottom cover plate 110 (shown in FIGS. 5, 6) or to the top cover plate 108 (shown in FIG. 10) and an anodic bond 142 is formed therebetween. The pillars 102 are released from the mechanism substrate 114 and the underlying silicon wafer during etching subsequent to the anodic bonding the epitaxial silicon. The pillars 102 are mutually electrically isolated from one another as well as from the support structure 126 by being physically separated during fabrication. Unnecessary portions of the silicon mechanism substrate 114 are subsequently freed and rinsed away, as is well-known in the art.

The second or top cover plate 108 is formed with the appropriate structure 144 for cooperating with the device mechanism 112. Furthermore, according to one embodiment of the invention, the top cover plate 108 is formed with a plurality of internal pass-through cover windows 146, each of the windows 146 corresponding to one of the silicon pillars 102. The windows 146 in the top cover plate 108 are sized smaller than the pillar top surfaces 134. The second or top cover plate 108 having the plurality of windows 146 formed therein is assembled to the top surface 116 of the epitaxial silicon mechanism substrate 114 with each of the windows 146 aligned with one of the pillars 102. Because the windows 146 are smaller than the pillars 102, a completely closed peripheral portion 148 of the pillar top surfaces 134 overlap the cover 108 around the windows 146 and interfaces with the inner surface 104 of the top cover plate 108. Therefore, the windows 146 are completely blocked and closed by the pillars 102. Anodic bonds 150 are formed between the overlapping peripheral portion 148 of the pillar top surfaces 134 and the inner surface 104 of the top cover plate 108. The anodic bonds 150 hermetically seal the windows 146.

The semiconductor silicon pillars 102 thereafter extend between the second electrical contacts 130 at the second end of the corresponding electrical conductor 120 and the windows 146 in the top cover plate 108, whereby the semiconductor silicon pillars 102 provides an electrically conductive path between the device mechanism 112 inside the MEMS device 100 and an exterior surface, i.e., the top surfaces 134 of the semiconductor silicon pillars 102 that are exposed through the corresponding windows 146.

The peripheral support structure 126, which completely surrounds the device mechanism 112, is simultaneously hermetically sealed by anodic bonds 152 formed around the periphery of the top cover plate 108. The combination of the anodically bonded pillars 102 and the anodically bonded peripheral support structure 126 serves to completely hermetically seal the MEMS device 100.

External electrical conductors 154, for example gold traces, are formed on the externally exposed top surfaces 134 of the pillars 102 within the windows 146. The pillars 102 and corresponding windows 146 are optionally cooperatively sized large enough to admit a wire bonding apparatus while maintaining the overlap 148 that provides the anodic bond 150 and the resulting hermetic seal. Therefore, the gold metal electrical conductors 154 are formed as conventional wire bond pads on the externally exposed top surfaces 134 of the pillars 102.

Alternatively, the external electrical conductors 154 are formed along an interior wall 156 of the window 146 and led to a conventional wire bond pad 158 formed on an external surface 160 of the top cover plate 108 where signals are routed into and out of the truly hermetically sealed MEMS device 100.

The internal and external electrical conductors 120 and 154 thus provide remote electrical access to the device mechanism 112, with the electrically conductive semiconductor silicon material of the pillars 102 forming an electrically conductive bridge between the interior and exterior of the MEMS device 100. The semiconductor silicon pillars 102 are sized so large relative to the internal and external electrical conductors 120 and 154 as to present negligible electrical resistance to passing signals routed into and out of the MEMS device 100. The semiconductor silicon pillars 102 thus form an effective electrically conductive bridge between the electrical conductors 120 and 154 interior and exterior of the MEMS device 100.

The silicon material of the pillars 102 simultaneously forms an anodic bond that hermetically seals the pass-through windows 146 in the glass top cover plate 108. The anodic bonds 152, 142 between the peripheral support structure 126 and the respective top and bottom cover plates 108, 110 completes the hermetic seal of the MEMS device 100. Because the hermetic seals are formed during assembly of the top cover plate 108, after releasing the mechanism 112, the peripheral support structure 126 and the pillars 102, the device is purged of all contaminants during the freeing and rinsing away the unnecessary portions of the silicon mechanism substrate 114.

Furthermore, the MEMS device 100 is optionally anodically bonded in a clean, dry environment so that it is backfilled with a dry inert gas during assembly. The anodic bonds hermetically seal the device, preventing particulate and vapor contaminates from later entering the device. The conductive path provided by the electrically conductive semiconductor silicon material of the pillars 102 electrically bridging the internal and external electrical conductors 120 and 154 provide remote electrical access to the device mechanism 112, and the hermetic seals formed by the anodic bonds 150 between the pillars 102 and the top cover plate 108 combine with the peripheral hermetic seals formed by the anodic bonds 152, 142 between the peripheral support structure 126 and the respective top and bottom cover plates 108, 110 to permit the MEMS device 100 to be hermetically sealed with the inert gas environment retained within its interior, i.e., surrounding the device mechanism 112. Only the external conductors 154 and wire bond pads 158 lie outside the hermetic anodic bonds 150 and 152, 142 and remain exposed to the ambient environment.

Figure 7:
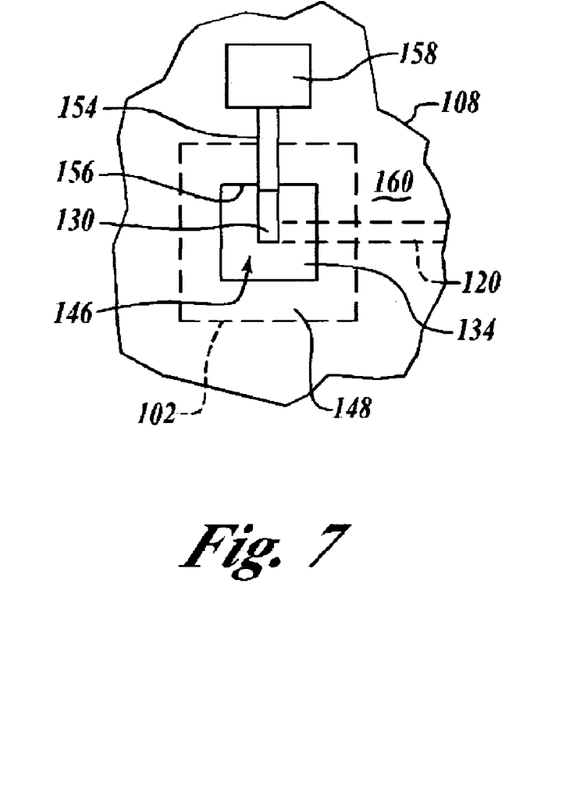
FIG. 7 is a blown-up plan view of one of the hermetically sealed windows of the invention illustrated in FIG. 5.

FIG. 7 is a blown-up plan view of one of the windows 146. FIG. 7 illustrates the electric conduction path formed between the internal electrical conductors 120 and the external electrical conductors 154 by the semiconductor silicon pillar 102. According to the embodiment of the invention illustrated in FIG. 7, one of the internal electrical conductors 120 is led to a point beneath each of the pillars 102 and includes an electrical contact 130 in that position. The pillar 102 is anodically bonded to the inner surface 106 of the bottom cover plate 110 in electrical contact with the bottom surface 136 of the pillar 102. After assembly of the top cover plate 108 the external electrical conductors 154 are formed along one interior wall 156 of the window 146 and led to the wire bond pad 158 formed on the external surface 160 of the top cover plate 108. When the interior walls 156 of the windows 146 are formed substantially vertically, as illustrated in FIGS. 6 and 7, one of the walls 156 is "seeded" according to a well-known process for adhering thereto the gold metal of the external electrical conductors 154.

FIG. 7 also illustrates the completely closed overlapping peripheral portion 148 of the top surface 134 of the pillar 102 and the material of the top cover plate 108 surrounding the window 146. As discussed above, the anodic bond. The anodic bonds 150 at the top surface 134 of the pillars 102 hermetically seal the windows 146.

Figure 8:
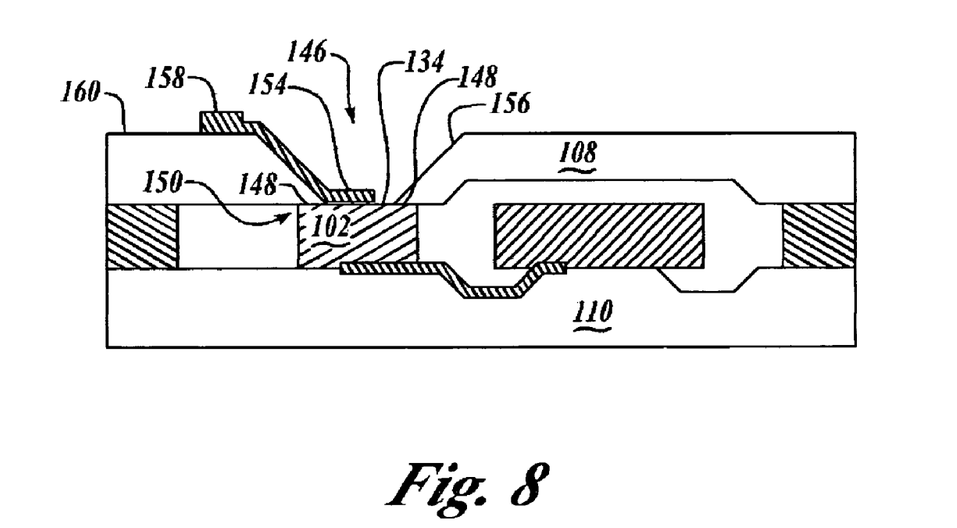
FIG. 8 is a cross-sectional side view of an alternative embodiment of the hermetically sealed MEMS device of the invention.
Figure 9:
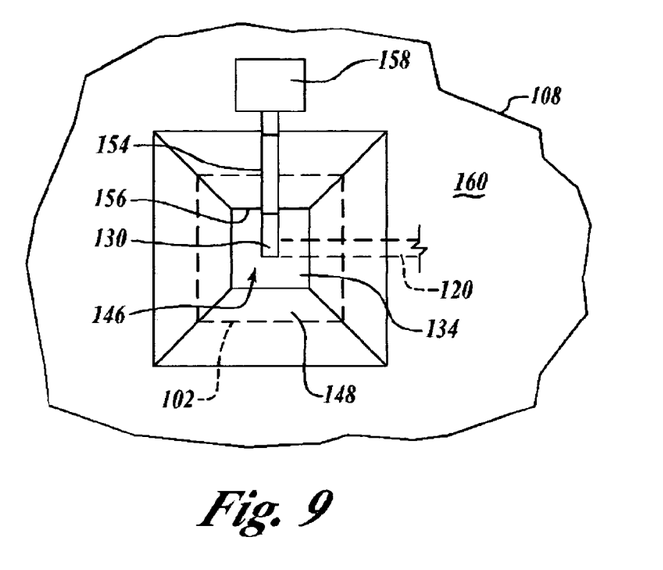
FIG. 9 is a blown-up plan view of one of the hermetically sealed windows of the invention illustrated in FIG. 8.

FIG. 8 and FIG. 9 illustrate an alternative embodiment of the invention wherein the interior walls 156 of the internal pass-through cover windows 146 are formed at an angle to the external surface 160 of the top cover plate 108, for example, as when the covers 108, 110 are formed in monocrystalline silicon substrates using conventional wet etching techniques. This embodiment of the window walls 156 permits ease of depositing the gold traces that form the external electrical conductors 154 between the top surface 134 of the pillar 102 and the external surface 160 of the top cover plate 108. Anodic bonding of the mechanism 112, the peripheral support structure 126 and the pillars 102 is accommodated by a thin glass film deposited, for example by sputtering, on the silicon cover plate 108.

Figure 10:
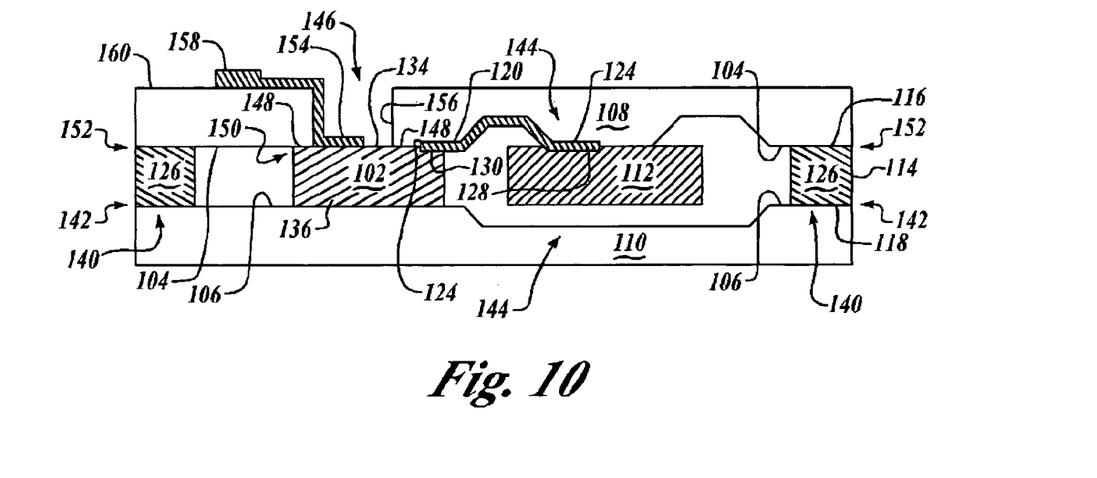
FIG. 10 is a cross-sectional side view of another alternative embodiment of the hermetically sealed MEMS device of the invention.

FIG. 10 illustrates one alternative embodiment of the invention wherein the plurality of semiconductor silicon columns or pillars 102 that are formed in the epitaxial silicon mechanism substrate 114 are situated to operate as an electrically conductive bridge between the electrical conductors 120 and 154 interior and exterior of the MEMS device 100. In the embodiment of FIG. 10 the channels 124 in which the interior electrical conductors 120 are formed are provided in the interior surface 104 of the top cover plate 108 with the electrical contact 130 adjacent to the internal pass-through window 146 in the top cover 108. The channels 124 end interior of the cover plate 108 material so that they are blocked from communicating with the interior walls 156 of the widows 146 by the cover plate material. The closed peripheral portion 148 of each of the pillar top surfaces 134 interfaces with the inner surface 104 of the top cover plate 108 between the extreme end of the electrical conductor channels 124 and the interior walls 156 of the widows 146. The pillars 102 are optionally enlarged over those illustrated in embodiments of FIGS. 5–9 to accommodate the interior electrical conductors 120 and electrical contact 130 that interface with the top surfaces 134 of the pillars 102 while sealing the corresponding windows 146. The anodic bond 150 formed between the pillar top surfaces 134 and the top cover plate 108 seals the corresponding widows 146.

Furthermore, according the embodiment illustrated in FIG. 10, the bottom cover plate 110 is optionally formed of the silicon substrate underlying the epitaxial layer 114 in which the mechanism 112, the peripheral support structure 126 and the pillars 102 are patterned. The silicon substrate has an substrate insulating layer patterned appropriately to separate the mechanism 112 and the mechanism layer of silicon from the underlying silicon substrate.

The Process

The invention is practiced in a clean room environment, utilizing the following materials and equipment. The materials utilized include silicon wafers for fabrication of the mechanism, and for fabrication of the cover plates, either Pyrex RTM glass wafers or silicon substrates having thin glass inner surfaces deposited thereon of a type that are known to be suitable for forming anodic silicon-to-glass bonds.

Alternatively, the invention is practiced using silicon wafer with an insulator, such as silicon oxide or another suitable insulator formed thereon.

The method of the invention for forming a hermetically sealed MEMS device includes: forming an epitaxial layer of semiconductor silicon on a silicon substrate; and in the epitaxial layer of semiconductor silicon, forming each of a micro-machined electromechanical device, a plurality of pillars that are physically separated from the micro-machined electromechanical device, and a seal ring surrounding the micro-machined electromechanical device and the pillars. The cover plates are formed with an internal surface that is structured to cooperate with the micro-machined electromechanical device and with a peripheral internal surface that is structured for joining to the seal ring. One of the cover plates is formed with a plurality of windows communicating between an inner surface and an outer surface of the cover plate. The windows are formed, by example and without limitation, by etching, lasing or drilling through the cover plate. The micro-machined electromechanical device, the pillars and the seal ring are joined by anodic bonding to one of the cover plates, the pillar is anodically bonded to a portion of the inner surface of the cover plate surrounding the window, and the seal ring is anodically bonded to a portion of each of the cover plates surrounding the micro-machined electromechanical device and the pillars and corresponding windows.

When the invention is practiced using silicon wafer with an insulator, the micro-machined electromechanical device, the pillars and the seal ring are joined by silicon fusion to one of the cover plates, the pillar is joined by silicon fusion to a portion of the inner surface of the cover plate surrounding the window, and the seal ring is joined by silicon fusion to a portion of each of the cover plates surrounding the micro-machined electromechanical device and the pillars and corresponding windows.

The micro-machined electromechanical device is electrically coupled with a portion of the pillar that is internal of the outer surface of the cover plate that has the window formed therein. A metal wire bond pad is electrically coupled to a surface of the pillar that is exposed in the window, the wire bond pad is either formed directly on the surface of the pillar that is exposed in the window, or the wire bond pad is alternatively positioned on the cover plate remotely from the window and is electrically coupled to the pillar by an electrical conductor.

While the preferred embodiment of the invention has been illustrated and described, it will be appreciated that various changes can be made therein without departing from the spirit and scope of the invention.

What is claimed is:

1. A hermetically sealed MEMS device, comprising:
a first cover plate having a first internal portion structured to cooperate with a micro-machined electromechanical device and formed with a pass-through window positioned at a second internal portion different from the first internal portion;
a micro-machined electromechanical device patterned in a layer of semiconductor silicon material and arranged relative to the cooperating first internal portion of the cover plate;
an internal seal device patterned in the layer of semiconductor silicon material and sized larger than the pass-through window, the internal seal device being joined to an internal surface of the cover plate in a sealing arrangement with the window and having an external surface area exposed in the window;
an internal electrical conductor arranged in electrical connection between the micro-machined electromechanical device and the internal seal device; and
an external electrical conductor arranged in electrical connection with the external surface area of the internal seal device exposed in the window.

2. The device of claim 1, further comprising a peripheral seal device patterned in the layer of semiconductor silicon material and surrounding the micro-machined electromechanical device and the internal seal device, the peripheral seal device being joined in a sealing arrangement with the internal surface of the cover plate.

3. The device of claim 2, further comprising a second cover plate arranged on an opposite side of the micro-machined electromechanical device from the first cover plate, an internal surface of the second cover plate being joined in a sealing arrangement with the peripheral seal device.

4. The device of claim 3 wherein the first and second cover plates further comprise glass cover plates.

5. The device of claim 4 wherein the internal seal device is further joined to the internal surface of the cover plate in an anodic bond.

6. The device of claim 1 wherein the external electrical conductor further comprises a metal wire bond pad arranged in electrical connection with the external surface area of the internal seal device that is exposed in the window.

7. The device of claim 1 wherein the external electrical conductor further comprises:
a metal electrical trace having a first portion arranged in electrical connection with the external surface area of the internal seal device that is exposed in the window,
a second portion in electrical connection with the first portion and arranged on an external portion of the cover plate, and
a metal wire bond pad arranged on the external portion of the cover plate in electrical connection with the second portion of the metal electrical trace.

8. A hermetically sealed MEMS device, comprising:
a micro-machined electromechanical device patterned in a layer of epitaxial semiconductor silicon;
a pillar patterned in the layer of epitaxial semiconductor silicon remotely from the micro-machined electromechanical device;
a closed seal ring patterned in the layer of epitaxial semiconductor silicon and completely surrounding both the micro-machined electromechanical device and the pillar;
a first cover structured to cooperate with the micro-machined electromechanical device and being joined in a sealed arrangement with the seal ring;
a pass-through window formed at an internal portion of the cover, the window communicating between an inner surface of the cover adjacent to the micro-machined electromechanical device and an outer surface of the cover spaced away from the micro-machined electromechanical device;
a window seal formed between the pillar and a portion of the cover inner surface surrounding the window;
a peripheral seal formed between the closed seal ring and a peripheral portion of the cover inner surface; and
an internal electrical conductor formed between the micro-machined electromechanical device and a surface of the pillar.

9. The device of claim 8 wherein the cover further comprises a glass cover.

10. The device of claim 9 wherein the window seal further comprises an anodic bond.

11. The device of claim 8 further comprising a second cover structured to cooperate with the micro-machined electromechanical device and being joined in a sealed arrangement with the seal ring opposite from the first cover.

12. The device of claim 8, further comprising an external wire bond pad electrically coupled to a surface of the pillar exposed in the window.

13. The device of claim 12 wherein the wire bond pad is formed on the surface of the pillar exposed in the window.

14. A hermetically sealed MEMS device, comprising:
a micro-machined electromechanical device formed of semiconductor silicon;
a pair of spaced apart top and bottom cover plates having glass inner surfaces structured to cooperate with the micro-machined electromechanical device, the inner surface of one of the top and bottom cover plates further having a plurality of electrically conductive metal traces extended between the micro-machined electromechanical device and a portion of the inner surface remote from the micro-machined electromechanical device, and one of the top and bottom cover plates further containing a pass-through window communicating between the inner surface of the cover plate and an exterior surface thereof;
a pillar formed of semiconductor silicon and joined to the inner surface of the cover plate containing the window in a closed ring surrounding the window;
an electrical conductor extending between the micro-machined electromechanical device and the pillar; and
a seal ring surrounding the micro-machined electromechanical device and the pillar and joined between the glass inner surfaces of the spaced apart top and bottom cover plates.

15. The device of claim 14 wherein the cover plates are formed of glass.

16. The device of claim 14, further comprising an anodic bond formed between the pillar and the inner surface of the top cover plate.

17. The device of claim 14, further comprising a wire bond pad electrically coupled to the pillar through the window.

18. A method of forming a hermetically sealed MEMS device, the method comprising:

forming in an epitaxial layer of semiconductor silicon each of a micro-machined electromechanical device, a pillar physically separated from the micro-machined electromechanical device, and a seal ring surrounding the micro-machined electromechanical device and the pillar;

forming in one or more glass substrates one or more cover plates having an internal surface structured to cooperate with the micro-machined electromechanical device and having a peripheral surface structured for joining to the seal ring, one of the cover plates being formed with a window communicating between an inner surface and an outer surface of the cover plate;

joining the micro-machined electromechanical device to one of the cover plates;

joining the pillar to the cover plate having the window formed therein in a sealing arrangement with the inner surface of the cover plate surrounding the window;

joining the seal ring to each of the one or more cover plates in a sealing arrangement surrounding the micro-machined electromechanical device and the pillar; and electrically coupling the micro-machined electromechanical device with a portion of the pillar internal of the outer surface of the cover plate having the window formed therein.

19. The method of claim 18 wherein joining the pillar to the cover plate further comprises anodically bonding a surface of the pillar to the inner surface of the cover plate surrounding the window.

20. The method of claim 18, further comprising electrically coupling a metal wire bond pad to a surface of the pillar exposed in the window.

* * * * *